United States Patent [19]
Tomita

[11] Patent Number: 6,084,294
[45] Date of Patent: Jul. 4, 2000

[54] SEMICONDUCTOR DEVICE COMPRISING STACKED SEMICONDUCTOR ELEMENTS

[75] Inventor: Yoshihiro Tomita, Tokyo, Japan

[73] Assignee: Mitsubishi Denki Kabushiki Kaisha, Tokyo, Japan

[21] Appl. No.: 09/243,486

[22] Filed: Feb. 3, 1999

[30] Foreign Application Priority Data

Aug. 26, 1998 [JP] Japan .................................. 10-240235

[51] Int. Cl.⁷ .......................... H01L 23/02; H01L 23/495; G06K 19/07; G11C 5/04
[52] U.S. Cl. ........................... 257/686; 257/685; 257/777; 257/666; 257/673; 257/476; 257/778; 361/813; 361/730
[58] Field of Search ..................................... 257/678, 666, 257/676, 673, 782, 781, 777, 778, 727, 685, 686, 630; 361/813, 730

[56] References Cited

U.S. PATENT DOCUMENTS

| | | | |
|---|---|---|---|
| 4,160,308 | 7/1979 | Courtney et al. ........................ | 438/25 |
| 4,523,219 | 6/1985 | Heidegger et al. ...................... | 257/726 |
| 5,049,527 | 9/1991 | Merrick et al. .......................... | 438/25 |
| 5,138,438 | 8/1992 | Masayuki et al. ....................... | 257/686 |
| 5,295,045 | 3/1994 | Kitano et al. ............................ | 257/784 |
| 5,448,511 | 9/1995 | Paurus et al. ............................ | 365/52 |
| 5,708,298 | 1/1998 | Masayuki et al. ....................... | 257/685 |
| 5,754,408 | 5/1998 | Derouiche ................................ | 361/773 |
| 5,789,815 | 8/1998 | Tessier ..................................... | 257/723 |
| 5,801,439 | 9/1998 | Fujisawa et al. ........................ | 257/686 |
| 5,910,685 | 6/1999 | Watanabe et al. ....................... | 257/777 |

FOREIGN PATENT DOCUMENTS

| | | |
|---|---|---|
| 4-29363 | 1/1992 | Japan . |
| 4-340266 | 11/1992 | Japan . |

*Primary Examiner*—Alexander Oscar Williams
*Attorney, Agent, or Firm*—McDermott, Will & Emery

[57] ABSTRACT

Electrodes of a semiconductor element are connected to lead wires provided on a flexible substrate, thereby forming a structural unit of a semiconductor element. A plurality of structural unit of a semiconductor elements are stacked on a mounting board, and the lead wires of each flexible substrate are electrically connected to wiring patterns on the package board. The stacked structure units of semiconductor elements are sealed on a package board through use of resin.

8 Claims, 3 Drawing Sheets

SEMICONDUCTOR DEVICE COMPRISING STACKED SEMICONDUCTOR ELEMENTS

BACKGROUND OF THE INVENTION

1. Field of the Invention

The present invention relates to a semiconductor device comprising stacked semiconductor elements.

2. Background Art

FIG. 6 shows one example of a conventional semiconductor device comprising stacked semiconductor elements. In FIG. 6, reference numerals 13a and 13b designate TSOP packages. The TSOP package 13a is mounted on and connected to a mounting board 14 by way of external leads 4a, and the TSOP package 13b is mounted on and connected to the mounting board 14 by way of external leads 4b.

In such a conventional semiconductor device, particularly in the case of a semiconductor device comprising TSOP packages, the outer leads 4a of the TSOP package 13a differ in length from the outer leads 4b of the TSOP package 13b. Therefore, each of these two types of outer leads requires a unique mold for bending outer leads. Further, there are also required peripheral components, such as sockets or trays, assuming different profiles, there by adding to the cost.

With such a conventional stacked mounting structure, a plurality of leads projecting to the outside from two sides or four sides of the package are mounted on the board while they are stacked on top of each other, thereby rendering mounting of stacked semiconductor elements difficult. For this reason, the design of the upper semiconductor package must differ from the design of the lower semiconductor package, thereby making it difficult to reduce the cost of the stacked semiconductor device.

SUMMARY OF THE INVENTION

The present invention has been conceived to solve such a problem of the conventional stacked semiconductor device, and the object of the present invention is to provide an inexpensive and compact stacked semiconductor device.

According to one aspect of the present invention, a semiconductor device comprises a plurality of structural units of a semiconductor element mounted on a mounting board. The mounting board has a wiring pattern on the major surface thereof. Each of the plurality of structural units of a semiconductor element includes a flexible substrate having lead wires formed thereon and a semiconductor element having electrodes formed thereon. Each semiconductor element is mounted on the flexible substrate so as to electrically connect the electrodes with the lead wires. Further, the plurality of structural units of a semiconductor element are stacked into a plurality of layers and mounted on the mounting board in such a way that the lead wires of each flexible substrate are brought to the wiring patterns of the mounting board so as to establish electrical connection therebetween.

According to another aspect of the present invention, a semiconductor device comprises a plurality of structural units of a semiconductor element mounted on a mounting board. The mounting board has a plurality of wiring patterns on the major surface thereof. Each of the plurality of structural units of a semiconductor element includes a common flexible substrate having a plural set of lead wires formed thereon and a semiconductor element having electrodes formed thereon. Each semiconductor element is mounted on the common flexible substrate so as to electrically connect the electrodes with one set of the lead wires. Further, the plurality of structural units of a semiconductor element are stacked into a plurality of layers and mounted on the mounting board by bending the flexible substrate in such a way that each set of the lead wires of the flexible substrate are brought to the wiring patterns of the mounting board so as to establish electrical connection therebetween.

Other and further objects, features and advantages of the invention will appear more fully from the following description.

DETAILED DESCRIPTION OF THE PREFERRED EMBODIMENTS

Figure 1A:
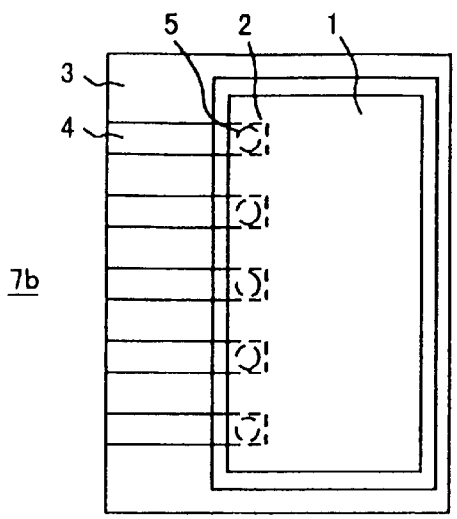
FIG. 1A shows, in the upper half, a plan view of a structural unit of a semiconductor element of a semiconductor device according to a first embodiment of the present invention, and, in the lower half, a side view of the structural unit of a semiconductor element.

Some of the preferred embodiments of the present invention will be described hereinafter by reference to the accompanying drawings. Throughout the drawings, like reference numerals are assigned like or corresponding elements, and repetition of their explanations will be simplified or omitted.

First Embodiment

Figure 1B:
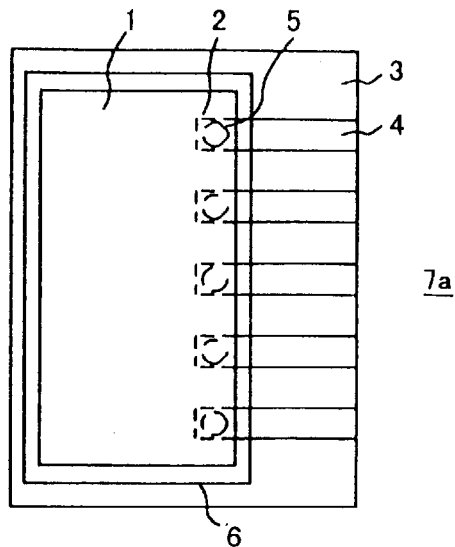
FIG. 1B shows another structural unit of a semiconductor element similar to that shown in FIG. 1A disposed symmetrically with the structural unit of a semiconductor element shown in FIG. 1A.
Figure 1B:
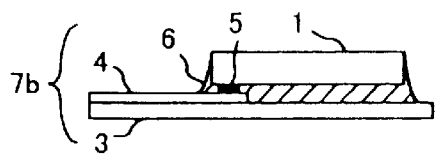
Figure 1B:
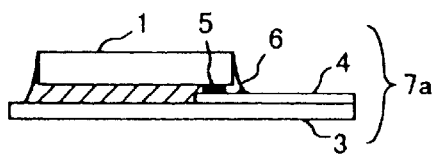
Figure 2:
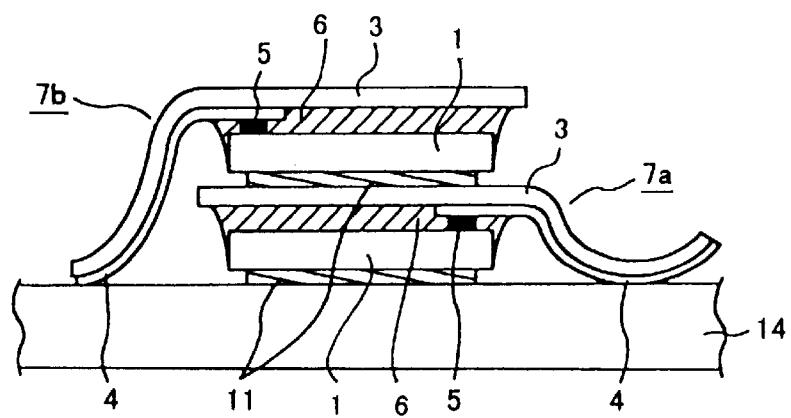
FIG. 2 is a cross-sectional view showing a semiconductor device comprising a plurality of structural units of a semiconductor element stacked together in the first embodiment of the present invention.

FIGS. 1A, 1B and 2 show the structure of a semiconductor device according to a first embodiment of the present invention. In FIG. 1B, the upper drawing is a plan view showing a structural unit of a semiconductor element when viewed from the top of the semiconductor element, and the lower drawing is a side view of the structural unit of a semiconductor element. FIG. 1B shows another structural unit of a semiconductor element similar to that shown in FIG. 1A disposed symmetrically with the structural unit of a semiconductor element shown in FIG. 1A. Further, FIG. 2 is a cross-sectional view showing a semiconductor device comprising a plurality of structural unit of a semiconductor elements, i.e., two structural unit of a semiconductor elements which are stacked together in the first embodiment.

In FIGS. 1A and 1B, reference numeral 1 designates a semiconductor element, and 2 designates a plurality of electrodes provided along one side of one major surface of the semiconductor element 1. Reference numeral 3 designates a flexible substrate (tape form substrate), and 4 designates lead wires (conductors) which are provided on the flexible substrate 3 and are drawn to the outside of the substrate from one side of the semiconductor element 1, thereby forming outer leads. Reference numeral 5 designates connection sections (bumps). In each connection section 5, the electrode 2 of the semiconductor element 1 is electrically brought into contact with the lead wire 4 of the flexible substrate 3 while they face each other. Reference numeral 6 designates a sealant for sealing the connection sections 5 and bonding the semiconductor element 1 on the flexible substrate 3. With the structure shown in FIG. 1A, there is formed a structural unit of a semiconductor element 7a. Similarly, with the structure shown in FIG. 1B, there is formed another structural unit of a semiconductor element 7b.

FIG. 2 is a cross-sectional view showing a semiconductor device formed by stacking together the structural unit of a semiconductor elements shown in FIGS. 1A and 1B. In FIG. 2, reference numeral 14 designates a mounting board on the major surface of which a wiring pattern (not shown) is formed, and 11 designates an adhesive for bonding the structural unit of a semiconductor element 7a on the mounting board 14 and for bonding together the structural unit of a semiconductor elements 7a and 7b.

The structural unit of a semiconductor elements 7a and 7b are each placed in such a way that the lead wires 4 provided on the major surface of the flexible substrate 3 face the surface of the mounting board 14. The side of the flexible substrate 3 having the lead wires provided thereon is gently bent such that the lead wires 4 become close to the surface of the mounting board 14, thereby establishing electrical connection between the lead wires 4 and the wiring patterns on the mounting board 14.

In FIG. 2, each structural unit of a semiconductor elements 7a and 7b may each have an identical structure, and each comprise lead wires provided on the flexible substrate 3. Consequently, there is no need to fold the lead wires in order to change the length of the lead wires. Further, the structural unit of a semiconductor elements can be formed inexpensively and thinly.

Although in FIGS, 1A and 1B the electrodes 2 are aligned along one side of the semiconductor element 1, the electrodes 2 may be aligned along two opposite sides or along four sides or in a two-dimensional pattern.

Further, the semiconductor device may be formed by stacking two or more structural unit of a semiconductor elements similar to the structural unit of a semiconductor elements 7a and 7b. Further, the semiconductor device may be wholly sealed.

Second Embodiment

Figure 3:
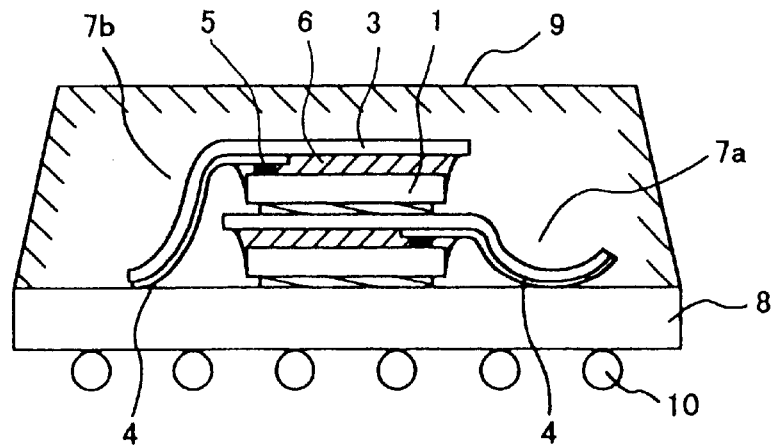
FIG. 3 is a side cross-sectional view showing a structure of a semiconductor device according to a second embodiment of the present invention.

FIG. 3 is a side cross-sectional view showing a structure of a semiconductor device according to a second embodiment of the present invention.

In FIG. 3, reference numerals 7a and 7b designate structural units of a semiconductor element shown in FIG. 1; 8 designates a package board; 10 designates outer terminals provided on the reverse side of the package board 8; and 9 designates sealing resin.

As in the case with the first embodiment, the structural units 7a and 7b of a semiconductor element are each mounted and positioned in such a way that the lead wires provided on the major surface of the flexible substrate 3 face the surface of the package board 8. The side of the flexible substrate 3 having the lead wires provided thereon is gently bent such that the lead wires 4 become close to the surface of the package board 8, thereby establishing electrical connection between the lead wires 4 and the wiring patterns on the surface of the package board 8.

Further, the wiring patterns provided on the surface of the package board 8 are connected to the outer terminals 10 provided on the reverse side of the package board 8.

The structural units of a semiconductor element 7a and 7b thus mounted on and connected to the major surface of the package board 8 are sealed by means of the sealing resin 9.

Even in the second embodiment, each structural unit of a semiconductor element 7a and 7b may have an identical structure, and each comprise lead wires provided on the flexible substrate 3. Consequently, there is no need to fold the lead wires in order to change the length of the lead wires. Further, the structural unit of a semiconductor element can be formed inexpensively and thinly.

Further, the semiconductor device may be formed by stacking two or more structural units of a semiconductor element similar to the structural units of a semiconductor element 7a and 7b.

As mentioned above, according to the second embodiment, a single, compact, inexpensive, and high-density semiconductor device can be formed by stacking together the structural units of a semiconductor element 7a and 7b.

The method of sealing a semiconductor device is not limited to a lid sealing method or a pot sealing method; a can sealing method may also be used. Further, the shape of the outer terminals 10 is not limited to a lead pattern or a pin-shaped pattern.

Even in the second embodiment, although the electrodes 2 are aligned along one side of the semiconductor element 1, the electrodes 2 may be aligned along two opposite sides or along four sides or in a two-dimensional pattern.

Third Embodiment

Figure 4:
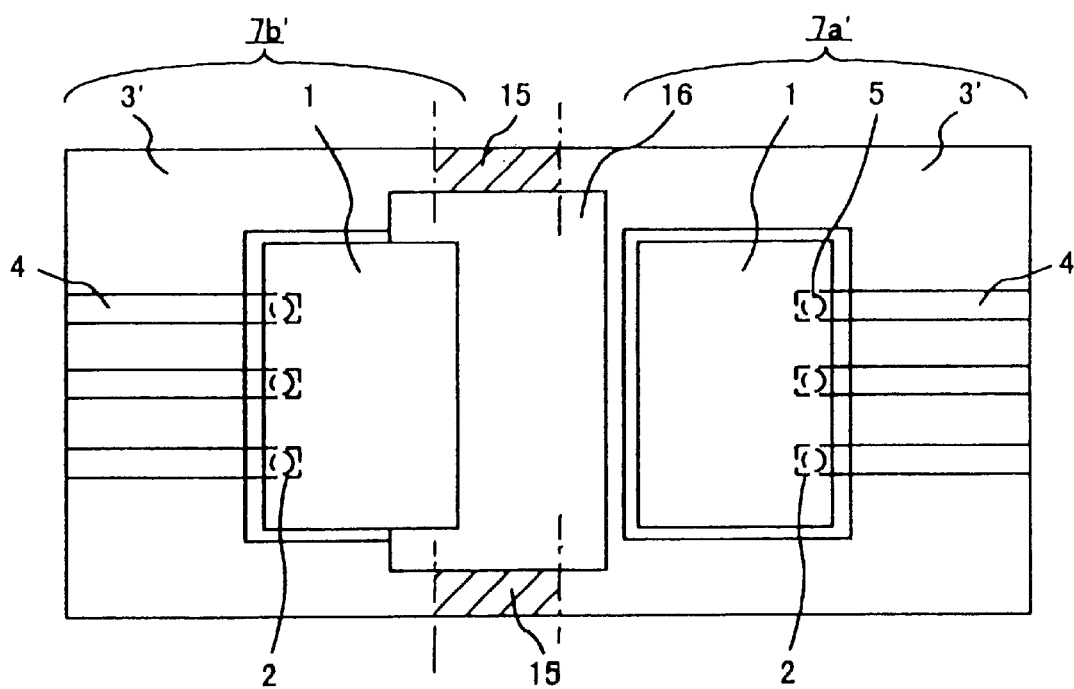
FIG. 4 is a plan view showing a pair of structural units of a semiconductor element before assembly of a semiconductor device according to a third embodiment of the present invention.
Figure 5:
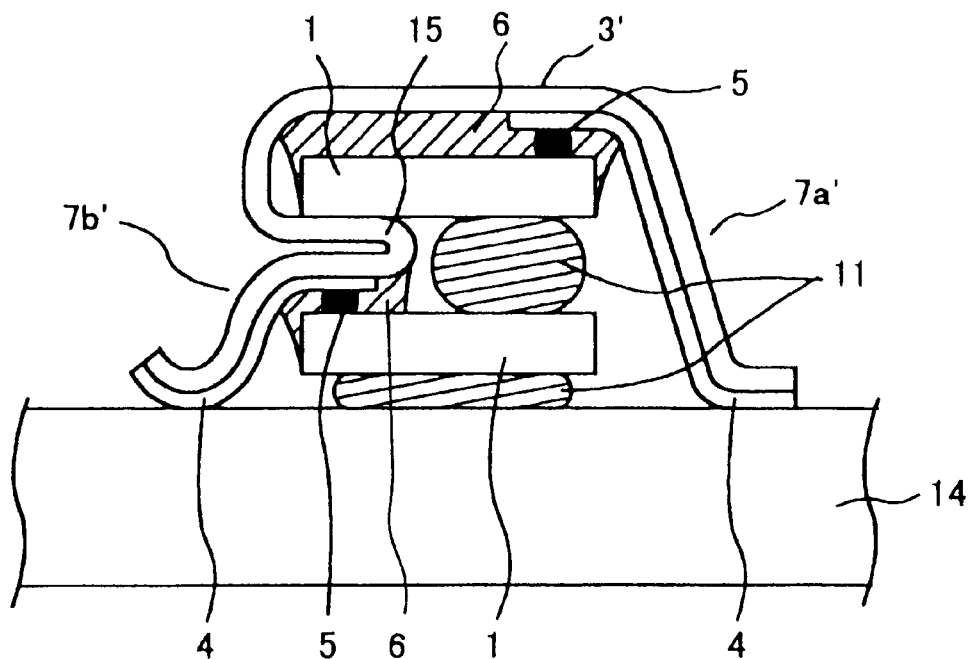
FIG. 5 is a lateral cross-sectional view showing an assembly of the structural units of a semiconductor element as a semiconductor device according to a third embodiment of the present invention.
Figure 6:
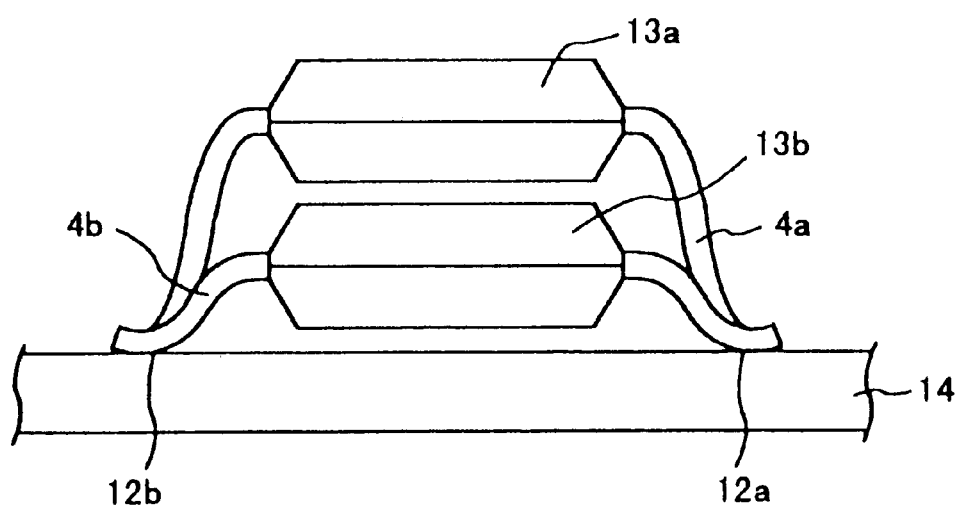
FIG. 6 shows one example of a conventional semiconductor device comprising stacked semiconductor elements.

FIGS. 4 and 5 show a structure of a semiconductor device according to a third embodiment of the present invention. FIG. 4 is a plan view showing a pair of structural units of a semiconductor element before assembly, and FIG. 5 is a lateral cross-sectional view showing an assembly of the structural units of a semiconductor element.

In FIG. 4, reference numeral 3' designates a flexible substrate; 15 designates a region that can be folded (hereinafter called a "folding region"); and 16 designates a blank portion.

As mentioned above, the flexible substrate 3' has a rectangular shape, and adjacent semiconductor elements 1 are provided symmetrically on the flexible substrate 3'. A blank portion is patterned in the region of the flexible substrate 3' between the adjacent semiconductor elements 1. The areas remaining along the shorter sides of the blank portion constitute the folding regions 15. Provided that an imaginary line is drawn so as to divide the flexible substrates 3' into two segments in the longitudinal direction, the segments constitute structural units of a semiconductor element 7a' and 7b'.

FIG. 5 shows the structural unit of a semiconductor elements 7a' and 7b' when they are stacked on the mounting board 14 by bending the flexible substrate 3' shown in FIG. 4 along the folding region 15 and are fixed by means of an adhesive 11.

The structural units of a semiconductor element 7a' and 7b' are each mounted and positioned in such a way that the lead wires 4 provided on the major surface of the flexible substrate 3' face the surface of the mounting board 14. The side of the flexible substrate 3' having the lead wires provided thereon is gently bent such that the lead wires 4 become close to the surface of the mounting board 14, thereby establishing electrical connection between the lead wires 4 and the wiring patterns on the surface of the mounting board 14.

According to the third embodiment, a plurality of structural units of a semiconductor element are formed on a single flexible substrate 3'. A semiconductor device, which is similar in structure to that according to the first embodiment, can be formed by bending the flexible substrate 3' so as to stack together the structural units of a semiconductor element.

As mentioned above, according to the third embodiment, a single, compact, inexpensive, and high-density semiconductor device can be formed by stacking together the structural units of a semiconductor element 7a' and 7b'.

In the third embodiment, as in the case with the second embodiment, a stacked semiconductor device can be formed by stacking the structural units of a semiconductor element on the package board. The manufacturing method for and the structure of the semiconductor device can be understood from the description related to the second embodiment, and hence repetition of the detailed explanation will be omitted here.

As mentioned above, according to the present invention, there can be obtained an inexpensive and compact stacked semiconductor device.

The entire disclosure of a Japanese Patent Application No. 10-240235, filed on Aug. 26, 1998 including specification, claims, drawings and summary, on which the Convention priority of the present application is based, are incorporated herein by reference in its entirety.

Obviously many modifications and variations of the present invention are possible in the light of the above teachings. It is therefore to be understood that within the scope of the appended claims the invention may by practiced otherwise than as specifically described.

What is claimed is:

1. A semiconductor device comprising:
   a mounting board having a wiring pattern on a major surface thereof; and
   a plurality of structural units, each structural unit comprising:
      a flexible substrate having lead wires formed thereon; and
      a semiconductor element having electrodes formed thereon and
   being mounted on said flexible substrate so as to electrically connect said electrodes with said lead wires,
   wherein said plurality of structural units are stacked into a plurality of layers and mounted on said mounting board by said flexible substrate bent in such a way that said lead wires of said flexible substrate are brought to said wiring pattern of said mounting board so as to establish electrical connection therebetween.

2. The semiconductor device according to claim 1,
   wherein said mounting board is a package board having a wiring pattern on the major surface thereof and outer terminals on the rear surface thereof connected to said wiring pattern;
   and wherein said plurality of said stacked structural units of a semiconductor element are sealed on said package board.

3. The semiconductor device according to claim 1, wherein said electrodes of said semiconductor element are aligned along one side of said semiconductor element.

4. The semiconductor device according to claim 1, wherein said plurality of the structural units of a semiconductor element are formed into identical shapes.

5. A semiconductor device comprising:
   a mounting board having a plurality of wiring patterns on a major surface thereof; and
   a plurality of structural units, each structural unit comprising:
      a common flexible substrate having a plural set of lead wires formed thereon; and
      a semiconductor element having electrodes formed thereon and
   being mounted on said common flexible substrate so as to electrically connect said electrodes with one set of said lead wires,
   wherein said plurality of structural units are staked into a plurality of layers and mounted on said mounting board by said flexible substrate bent in such a way that each set of the lead wires of said flexible substrate are brought to said wiring patterns of said mounting board so as to establish electrical connection therebetween.

6. A semiconductor device according to claim 5,
   wherein said mounting board is a package board having a wiring pattern on the major surface thereof and outer terminals on the rear surface thereof connected to said wiring pattern;
   and wherein said plurality of said stacked structural units of a semiconductor element are sealed on said package board.

7. The semiconductor device according to claim 5, wherein said electrodes of said semiconductor elements are aligned along one side of said semiconductor element.

8. The semiconductor device according to claim 5, wherein adjacent structural unit of a semiconductor elements are provided on said flexible substrate in a symmetrical pattern.

* * * * *